United States Patent

Borden

Patent Number: 5,935,723
Date of Patent: Aug. 10, 1999

[54] ENVIRONMENTALLY RESISTANT, INFRARED-TRANSPARENT WINDOW STRUCTURE

[75] Inventor: Michael R. Borden, Redondo Beach, Calif.

[73] Assignee: Raytheon Company, Lexington, Mass.

[21] Appl. No.: 08/870,343

[22] Filed: Jun. 6, 1997

[51] Int. Cl.$^6$ ..................................................... B32B 17/00
[52] U.S. Cl. .......................... 428/698; 428/699; 428/701; 428/702; 428/68; 428/76; 359/350; 359/359; 359/360
[58] Field of Search ..................................... 428/698, 699, 428/701, 702, 447, 68, 76; 359/350, 359, 360

[56] References Cited

U.S. PATENT DOCUMENTS

| 4,778,731 | 10/1988 | Kraatz et al. | 428/623 |
|---|---|---|---|
| 4,809,293 | 2/1989 | DeBell et al. | 372/98 |
| 4,907,846 | 3/1990 | Tustison | 359/350 |
| 5,067,781 | 11/1991 | Montanari | 359/350 |
| 5,194,985 | 3/1993 | Hilton, Sr. | 359/350 |
| 5,242,709 | 9/1993 | Chaffin, III. | |

FOREIGN PATENT DOCUMENTS

| 0317264 A2 | 5/1989 | European Pat. Off. |
| WO 97/13169 | 4/1997 | WIPO |
| WO 98/04935 | 2/1998 | WIPO |

*Primary Examiner*—Timothy M. Speer
*Attorney, Agent, or Firm*—Colin M. Raufer; Leonard A. Alkov; Glenn H. Lenzen, Jr.

[57] ABSTRACT

A window structure includes a first window layer including a zinc sulfide substrate coated on each side with an antireflective coating, and a second window layer including a sapphire substrate coated on each side with an antireflective coating. The two window layers are bonded together in a facing-but-spaced-apart relation by an infrared-transparent adhesive layer, preferably a silicone rubber. The window is placed into the wall of a sensor housing that contains an infrared sensor.

20 Claims, 3 Drawing Sheets

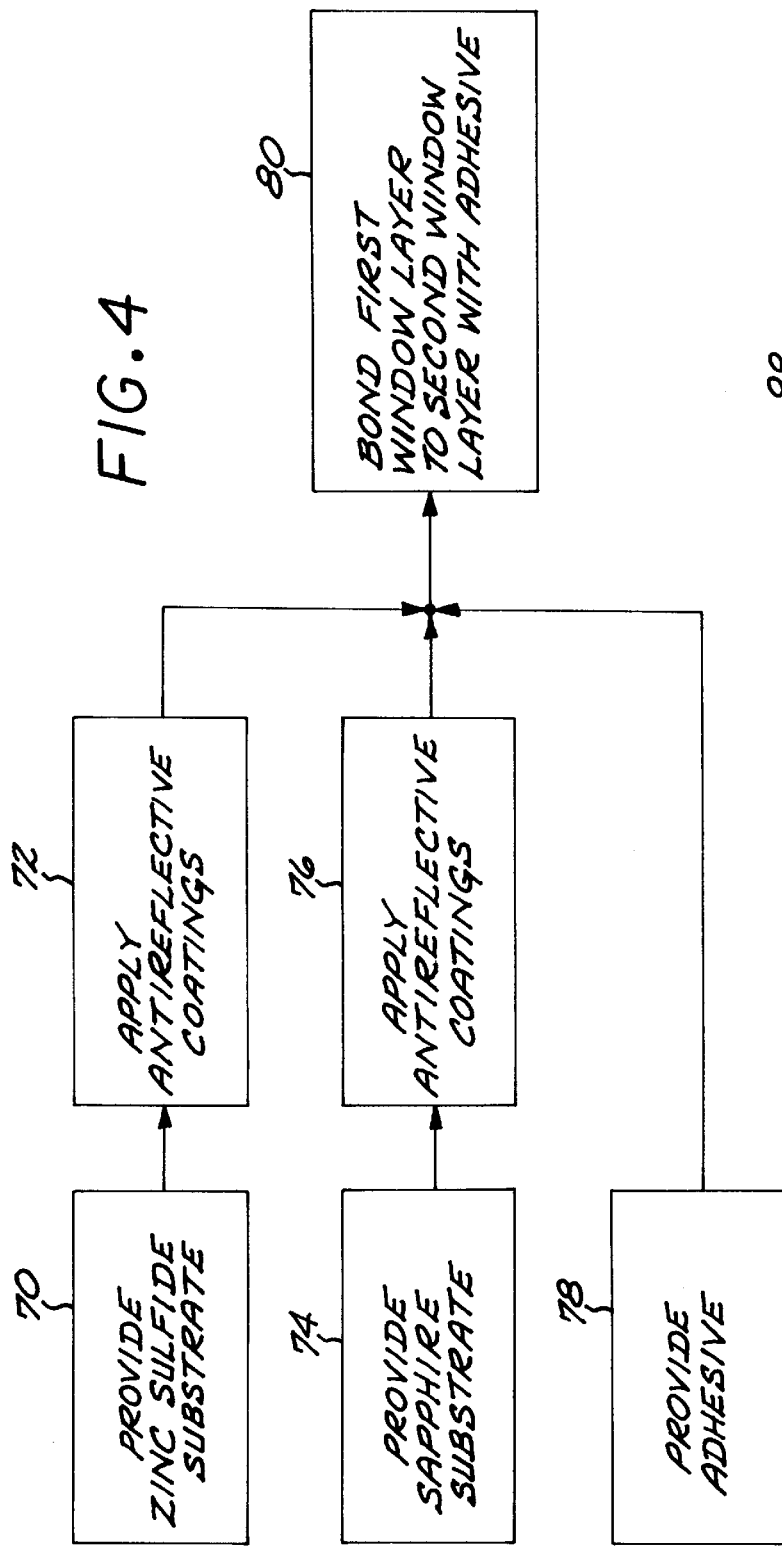
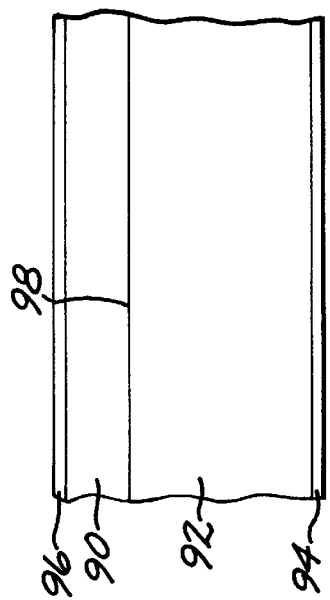

ENVIRONMENTALLY RESISTANT, INFRARED-TRANSPARENT WINDOW STRUCTURE

This invention relates to an infrared-transparent window structure, and, more particularly, to such a window structure that is highly resistant to externally induced damage.

Sensors operating in the infrared wavelength bands are used in civilian and military applications. Such sensors are usually rather fragile in construction and susceptible to external damage. They are therefore usually placed behind a protective window that is transparent to the radiation being sensed but protects the sensor from damage due to hostile physical and chemical environmental effects, impacts, and the like.

The window material must be transparent to infrared radiation, and it must be of sufficient strength to support itself and bear imposed loadings such as those imposed by aerodynamic forces and by impacts. Sapphire, a form of aluminum oxide, is highly resistant to external damage and is transparent to infrared radiation in the medium wavelength infrared band when the sapphire is thin, but suffers from reduced transmittance with increasing thickness. Sapphire is used for small-size infrared-transparent windows, but it cannot be used for larger windows because the larger windows require greater thicknesses of the window material for structural strength, and the greater thickness results in loss of transmittance in the medium wavelength infrared band. For example, a ¼ inch diameter window may be made of thin sapphire, but an 8-inch diameter infrared window cannot be made of thin sapphire, because such a large window is not sufficiently strong to bear the externally imposed loadings.

Other window materials such as zinc sulfide retain their good transmittance in the medium wavelength infrared band even to the relatively large thicknesses required in large-diameter windows. However, these materials are not sufficiently resistant to external damage to be used as windows in many applications such as high-speed aircraft, as even dust and raindrops in the air which impact upon the window during flight quickly cause it to erode.

There is a need for an improved approach to the design and construction of environmentally resistant infrared windows. The present invention fulfills this need, and further provides related advantages.

SUMMARY OF THE INVENTION

The present invention provides an infrared-transparent window that is highly resistant to external environmental damage. The transmission of infrared energy is good, even at high angles of incidence of the infrared energy. The window of the invention may be made in large sizes as required.

In accordance with the invention, a window structure comprises a first infrared-transparent window layer, a second infrared-transparent, environmentally resistant window layer, and an infrared-transparent adhesive bonding the first window layer to the second window layer in a facing relation. The first window layer includes a first-window substrate, which is preferably zinc sulfide but could also be zinc selenide. The second window layer includes a second-window substrate, which is preferably sapphire but could also be other forms of aluminum oxide, spinel, silicon carbide, zirconium, dioxide, or aluminum nitride. There is desirably a first antireflective coating on a first side of the first-window substrate, a second antireflective coating on a second side of the first-window substrate, a third antireflective coating on a first side of the second-window substrate, and a fourth antireflective coating on a second side of the second-window substrate.

The second-window substrate is relatively thin, from about 0.005 inch to about 0.040 inch thick, and is preferably made of aluminum oxide and most preferably sapphire. The second-window substrate is preferably made of visibly transparent zinc sulfide, sometimes termed multispectral zinc sulfide or Cleartran. The first-window substrate is typically much thicker than the second-window substrate, and is preferably from about 0.2 inch to about 1.0 inch thick. The first-window substrate provides the structural strength required in a window subjected to aerodynamic and other loadings, and the second-window substrate provides the environmental resistance needed to protect the first-window substrate.

The adhesive that bonds the first window layer to the second window layer must be transmissive to infrared radiation and must provide structural strength. The preferred adhesive is a silicone rubber adhesive. The adhesive layer is preferably as thin as reasonably possible. The adhesive layer is typically from about 0.001 inch to about 0.004 inch thick, most preferably about 0.002 inch thick. The adhesive may be applied over the entire facing surfaces of the first and second window layers, with relatively minor attenuation and distortion of the transmitted infrared energy. Alternatively, the adhesive may be applied only at the periphery of the window layer, so that an air gap separates the two window layers.

The two window substrates are each coated on both sides with an antireflective coating. Multilayer antireflective coatings known for other applications are preferably used in forms optimized for the adjacent medium. The ability to have such antireflective coatings is an important feature of the invention, distinguishing it from a window design wherein the second-window substrate material is deposited directly onto the first-window substrate material. In the present design, the antireflective coatings at the interfaces with the adhesive are optimized for the infrared wavelength of interest to achieve good transmission even at high angles of incident infrared energy. By contrast, in the case where the second-window substrate is in direct contact with the first-window substrate, the interface between the two constitutes a reflective surface that adversely affects optical performance, particularly for high incident angles of the infrared energy. Thus, while it might be expected that the presence of the adhesive would adversely affect the optical performance of window, it has been found that the attenuation and distortion of the transmitted infrared energy is relatively small. The advantages resulting from providing the antireflective coatings between the first-window substrate and the second-window substrate far outweighs the minor disadvantages resulting from the presence of the adhesive.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 4 is a block diagram of a method for practicing the invention; and

FIG. 5 is a sectional view of a window construction that is not within the scope of the invention.

DETAILED DESCRIPTION OF THE INVENTION

Figure 1A:
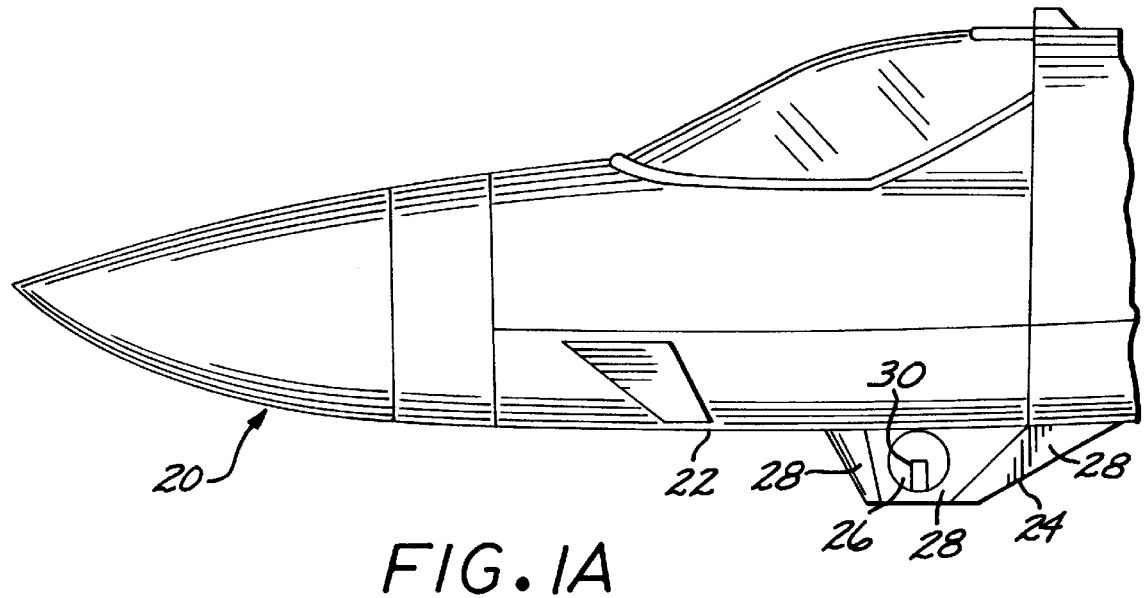
FIG. 1A is a partial elevational view of an aircraft having an infrared sensor.

FIG. 1A illustrates a preferred application of the window of the invention in an aircraft 20 having an airframe 22 and infrared sensor system 24 mounted to the airframe. The sensor system 24 includes a sensor ball 26 mounted inside a window structure 28. The sensor ball 26 includes an infrared sensor 30 mounted therein. The sensor ball 26 may be rotated to aim the sensor 30 as desired. The sensor 30 views a scene through the window structure 28, and accordingly the window structure 28 must be transparent to radiation of the wavelength of interest for the sensor 30. The aircraft 20, the sensor system 24, and the associated elements, with the exception of the window structure to be described subsequently, are known in the art.

Figure 1B:
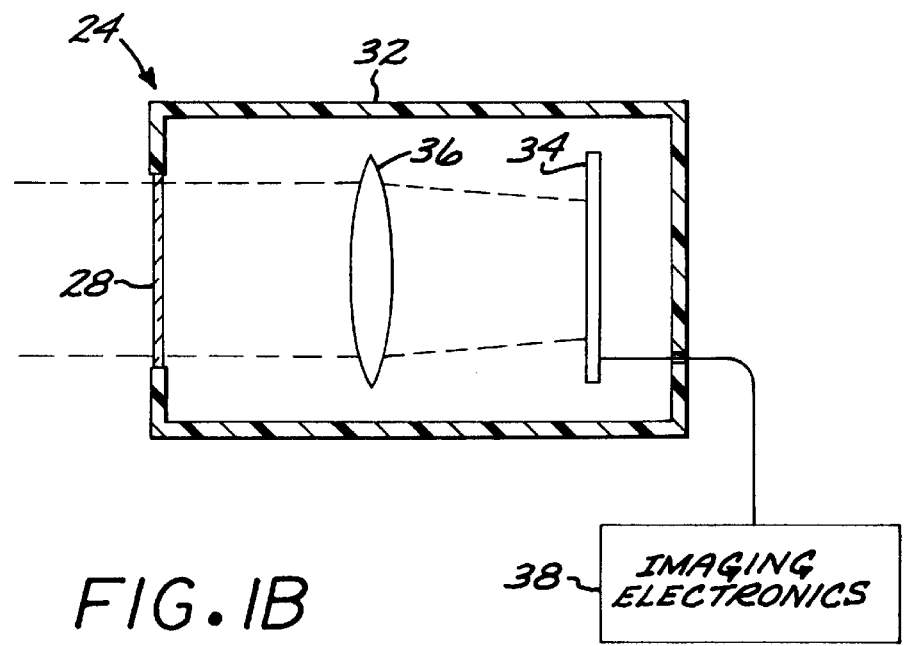
FIG. 1B is a schematic interior view of a sensor arrangement.

FIG. 1B schematically illustrates the components of the sensor system 24 in greater detail. The sensor system 24 includes a housing 32 having the window structure 28 therethrough. Within the housing 32 is a sensor 34 and appropriate optics 36, here schematically represented as a single lens. Infrared energy enters the housing through the window structure 28 and is imaged onto the sensor 34 by the optics 36. The sensor converts the incident infrared energy into an electrical signal that is transmitted to imaging electronics 38, which are generally located exterior to the housing 32. The imaging may be digital or analog, and the resulting image may be viewed by a human operator or processed automatically. The sensor system 24 has been illustrated in relation to an aircraft application, the most-preferred application of the inventor. However, the sensor system 24 may be utilized for any other operable application such as, for example, in a spacecraft, a land vehicle, a stationary facility, a hand-held unit, or a weapon sight.

Figure 2:
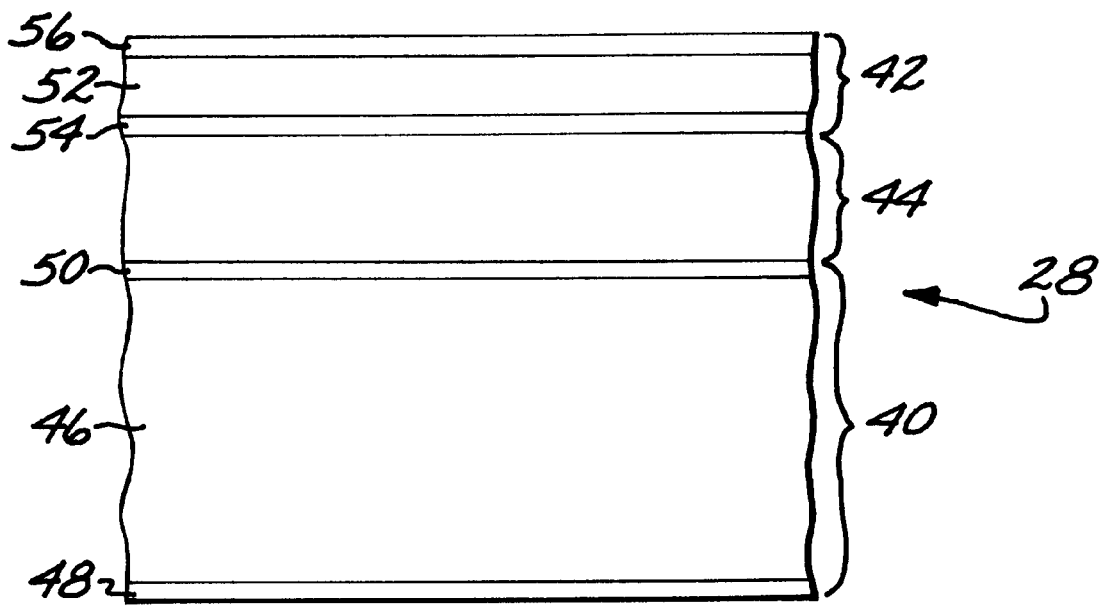
FIG. 2 is a sectional view of an infrared-transparent window structure.

FIG. 2 is a section through the window structure 28. The window structure 28 includes a first window layer 40, a second window layer 42, and an adhesive layer 44 bonding the first window layer 40 to the second window layer 42 in a facing-but-spaced-apart relationship. FIG. 2 is not drawn to scale. As will be discussed subsequently, the first window layer 40 is typically much thicker than the second window layer 42, and the antireflective coatings are quite thin.

The first window layer 40 includes a first-window substrate 46. The first-window substrate 46 may be made of any operable material, such as zinc sulfide or zinc selenide, but zinc sulfide is preferred. The first-window substrate 46 is the primary load-bearing element of the window structure 28. It is made with a thickness sufficient to bear the aerodynamic and other loadings imposed on the window. The thickness of the first-window substrate 46 is increased as the lateral size of the window structure 28 is increased. In a typical case, however, the zinc sulfide window is from about 0.2 inch to about 1.0 inch thick. Preferably, a first antireflective coating 48 is deposited upon and overlies a first side of the first-window substrate 46, and a second antireflective coating 50 is deposited upon and overlies a second side of the first-window substrate 46.

The second window layer 42 includes a second-window substrate 52. The second-window substrate 52 is sufficiently thick to resist erosion, impact, chemical damage, and other types of externally induced damage expected in the application of interest. The second-window substrate 52 is made of any operable material, but is preferably made of aluminum oxide, spinel, silicon carbide, zirconium dioxide, or aluminum nitride. The term "aluminum oxide" as used herein encompasses aluminum oxide of various types, and specifically includes sapphire, the most preferred material for the second-window substrate 52. The second-window substrate 52 is preferably no thicker than necessary to be provided and handled as a separate, freestanding element from the first-window substrate 46. Preferably, the second-window substrate is from about 0.005 to about 0.040 inches thick. Thinner substrates have insufficient structural strength to be handled, and thicker substrates unnecessarily increase the attenuation of the infrared energy passing therethrough at the high end of the medium wavelength infrared band. More specifically, the aluminum oxide is not thicker than about 0.040 inches, due to significant loss of transmittance above 4 micrometers wavelength. Preferably, a third antireflective coating 54 is deposited upon and overlies a first side of the second-window substrate 52, and a fourth antireflective coating 56 is deposited upon and overlies a second side of the second-window substrate 52.

The first window layer 40 is bonded to the second window layer 42 by the adhesive layer 44. The adhesive layer 44 is made of a material that serves as an adhesive and is also transparent to infrared radiation. A preferred adhesive material is a silicone elastomer or rubber, most preferably polydimethylsiloxane. The thickness of the adhesive layer 44 is no thicker than necessary to achieve the bonding, inasmuch as it lies in the optical path of the infrared energy. The adhesive layer 44 is preferably from about 0.001 inch to about 0.004 inch, most preferably about 0.002 inch, thick. Thinner layers cannot be reliably applied, and thicker layers result in increased absorption of the infrared energy with no associated benefit.

The adhesive layer 44 may cover the entire facing portions of the window layers 40 and 42, as illustrated, or it may cover only portions thereof. For example, the adhesive layer 44 could be positioned only around the periphery of the window, so that there is an air gap between the layers 40 and 42 in the central portion of the window structure. In either event, the layers 40 and 42 are spaced apart from each other but in a facing relationship.

Figure 3:
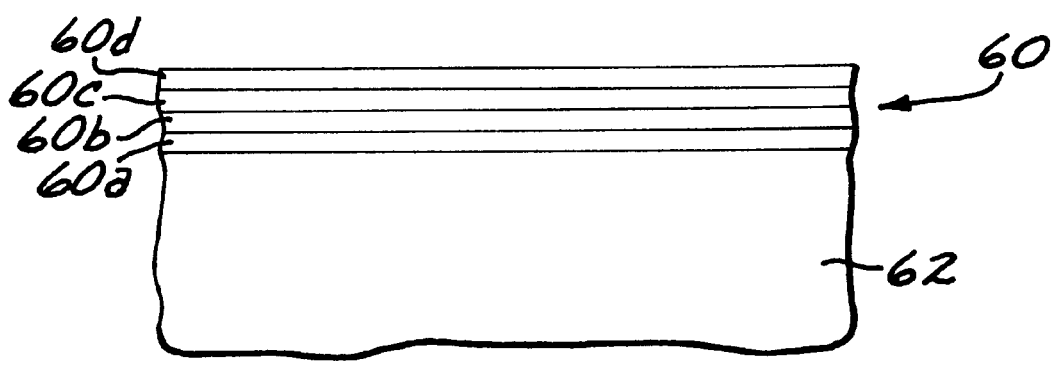
FIG. 3 is a sectional view of an antireflective coating used on the window structure of FIG. 2.

FIG. 3 illustrates in general form an antireflective coating 60 of the type used for the antireflective coatings 48, 50, 54, and 56, in contact with a substrate 62. Such antireflective coatings are known in the art for other applications. See, for example, U.S. Pat. No. 4,778,731, whose disclosure is incorporated by reference. The antireflective coating 60 includes multiple sublayers, usually 3–10 sublayers, schematically illustrated in FIG. 3 as four sublayers 60a, 60b, 60c, and 60d. The sublayers are typically made of submicron thicknesses of yttrium oxide, silicon oxide, magnesium fluoride, zinc sulfide, or hafnium oxide. The types and thicknesses of the sublayers are selected to optimize the performance of the antireflective coating 60 according to the refractive indices of the two media on either side of the coating according to principles well known in the art. For example, in the preferred embodiment the first antireflective layer 48 is optimized for air on one side and zinc sulfide on the other. The second antireflective coating 50 is optimized for zinc sulfide on one side and the adhesive material on the other. The third antireflective coating 54 is optimized for adhesive material on one side and aluminum oxide on the other. The fourth antireflective coating 56 is optimized for aluminum oxide on one side and air on the other.

FIG. 4 is a block diagram of a procedure for preparing the window structure 28. The first-window substrate 46 is provided in a thickness determined to be sufficient to withstand aerodynamic and other loadings, numeral 70. Zinc sulfide is selected as the preferred primary load-bearing material for the window structure because of its strength, high infrared transmission in the 1–5 micrometer wavelength band that is of most interest for infrared sensors and also encompasses the operating ranges of targeting and eyesafe lasers, and commercial availability in sizes suitable for a wide range of window applications. The larger the window and the higher the loadings, the thicker is the window. The first-window substrate 46 is coated on one side with the first antireflective coating 48 and on the other side with the second antireflective coating 50, numeral 72.

The second-window substrate 52 is provided in a thickness suitable for preparation and handling in the required size for the window structure 28, but not thicker than necessary, numeral 74. The second-window substrate is preferably from about 0.005 to about 0.040 inches thick. Aluminum oxide, most preferably sapphire, is chosen as the substrate of the second window layer 42 because of its durability and resistance to impact, erosion, and chemical damage. Aluminum oxide is available in sizes suitable for many window structures 28. If a larger size than that available commercially is required, several aluminum oxide pieces may be laterally tiled together to achieve full coverage of the surface of the window structure. The second-window substrate 52 is coated on one side with the third antireflective coating 54 and on the other side with the fourth antireflective coating 56, numeral 76.

The adhesive used in the adhesive layer 44 is provided, numeral 78. The adhesive must have good infrared transmission and also serve the bonding function of an adhesive. Silicone elastomeric adhesives are preferred.

The first window layer 40 is bonded to the second window layer 42 by applying the adhesive to one or both of the facing surfaces and placing them into facing-but-spaced-apart contact, numeral 80. The amount of adhesive is selected so that the adhesive layer 44 is from about 0.001 inch to about 0.004 inch thick.

According to this procedure and the window structure shown in FIG. 2, the first window layer 40 and the second window layer 42 are prepared as freestanding elements and then bonded together by the adhesive. This procedure is contrasted with a procedure, not within the scope of the invention, that produces a structure such as that shown in FIG. 5. In that approach, an aluminum oxide layer 90 is deposited directly upon (not adhesively bonded to) and in contact with a zinc sulfide layer 92. Antireflective coatings 94 and 96 are thereafter applied on the outwardly facing surfaces. This structure, which is not within the scope of the invention, differs from that of the invention in two important respects. First, the layer 90 is deposited rather than grown separately, leading to lower optical properties. Second, there is a direct bond line 98 between the aluminum oxide and the zinc sulfide. This bond line 98 constitutes a reflective surface that interferes with infrared transmission through the structure, particular when the infrared energy is incident upon the structure at a high angle of incident (i.e., about 60 degrees or more from vertical incidence). Because the aluminum oxide layer 90 is deposited directly upon the zinc sulfide layer 92, it is not possible to provide a separately applied antireflective coating or coatings at this bond line 98, which would serve to alleviate the adverse influence of the bond line. Layers simulating antireflective coatings may be deposited onto the layer 92 prior to depositing the layer 90, but these layers are not as effective as those deposited upon freestanding pieces that are subsequently bonded together as in the present invention.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A window structure, comprising:
    a first window layer including a first-window substrate made of a material selected from the group consisting of zinc sulfide and zinc selenide;
    a second window layer including a second-window substrate selected from the group consisting of aluminum oxide, spinel, silicon carbide, zirconium dioxide, and aluminum nitride; and
    an infrared-transparent adhesive layer bonding the first window layer to the second window layer in a facing-but-spaced-apart relation.

2. The window structure of claim 1, wherein the first-window substrate is from about 0.2 inch to about 1 inch thick.

3. The window structure of claim 1, wherein the second-window substrate is from about 0.005 inch to about 0.040 inch thick.

4. The window structure of claim 1, wherein the aluminum oxide is sapphire.

5. The window structure of claim 1, wherein the adhesive layer is a silicone rubber.

6. The window structure of claim 1, further including
    a first antireflective coating on a first side of the first-window substrate, and
    a second antireflective coating on a second side of the first-window substrate.

7. The window structure of claim 1, further including
    a third antireflective coating on a first side of the second-window substrate, and
    a fourth antireflective coating on a second side of the second-window substrate.

8. The window structure of claim 1, further including
    a first antireflective coating on a first side of the first-window substrate,
    a second antireflective coating on a second side of the first-window substrate,
    a third antireflective coating on a first side of the second-window substrate, and
    a fourth antireflective coating on a second side of the second-window substrate.

9. The window structure of claim 6, wherein the adhesive layer extends over substantially all of one of the first antireflective coating and the second antireflective coating.

10. A window structure, comprising:
    a first window layer including
        a zinc sulfide substrate,
        a first antireflective coating on a first side of the zinc sulfide substrate, and
        a second antireflective coating on a second side of the zinc sulfide substrate;
    a second window layer including
        a sapphire substrate from about 0.005 to about 0.040 inches thick,
        a third antireflective coating on a first side of the sapphire substrate, and a fourth antireflective coating on a second side of the sapphire substrate; and an infrared-transparent adhesive layer bonding the first window layer to the second window layer in a facing-but-spaced-apart relation.

11. The window structure of claim 10, wherein the zinc sulfide substrate is from about 0.2 inch to about 1 inch thick.

12. The window structure of claim 10, wherein the adhesive layer is a silicone rubber.

13. A sensor system, comprising:

a sensor housing;

an infrared sensor contained within the housing;

a window structure in the sensor housing through which the infrared sensor views a scene, the window structure comprising a first window layer including a first-window substrate made of a material selected from the group consisting of zinc sulfide and zinc selenide, and a second window layer including a second-window substrate selected from the group consisting of aluminum oxide, spinel, silicon carbide, zirconium dioxide, and aluminum nitride; and an infrared-transparent adhesive layer bonding the first window layer to the second window layer in a facing-but-spaced-apart relation.

14. The sensor system of claim 13, wherein the first-window substrate is from about 0.2 inch to about 1 inch thick.

15. The sensor system of claim 13, wherein the second-window substrate is from about 0.005 inch to about 0.040 inch thick.

16. The sensor system of claim 13, wherein the aluminum oxide is sapphire.

17. The sensor system of claim 13, wherein the adhesive layer is a silicone rubber.

18. The sensor system of claim 13, further including a first antireflective coating on a first side of the first-window substrate, and a second antireflective coating on a second side of the first-window substrate.

19. The sensor system of claim 13, further including a third antireflective coating on a first side of the second-window substrate, and a fourth antireflective coating on a second side of the second-window substrate.

20. The sensor system of claim 13, further including a first antireflective coating on a first side of the first-window substrate, a second antireflective coating on a second side of the first-window substrate, a third antireflective coating on a first side of the second-window substrate, and a fourth antireflective coating on a second side of the second-window substrate.

* * * * *